(12) United States Patent
Uzoh

(10) Patent No.: US 9,397,051 B2
(45) Date of Patent: Jul. 19, 2016

(54) WARPAGE REDUCTION IN STRUCTURES WITH ELECTRICAL CIRCUITRY

(71) Applicant: Invensas Corporation, San Jose, CA (US)

(72) Inventor: Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/095,704

(22) Filed: Dec. 3, 2013

(65) Prior Publication Data

US 2015/0155241 A1    Jun. 4, 2015

(51) Int. Cl.
| | | |
|---|---|---|
| *H01L 21/302* | (2006.01) | |
| *H01L 23/00* | (2006.01) | |
| *H01L 21/3205* | (2006.01) | |

(52) U.S. Cl.
CPC ........ *H01L 23/562* (2013.01); *H01L 21/32051* (2013.01); *H01L 24/03* (2013.01); *H01L 24/05* (2013.01); *H01L 2224/0345* (2013.01); *H01L 2224/05124* (2013.01); *H01L 2224/05181* (2013.01); *H01L 2924/12042* (2013.01)

(58) Field of Classification Search
CPC ................ H01L 2924/3511; H01L 21/67288; Y10S 438/928
USPC ........................................................ 257/768
See application file for complete search history.

(56) References Cited

U.S. PATENT DOCUMENTS

| | | | |
|---|---|---|---|
| 4,213,698 A | | 7/1980 | Firtion et al. |
| 5,885,751 A | | 3/1999 | Weidman et al. |
| 5,892,281 A | * | 4/1999 | Akram et al. .................. 257/750 |

(Continued)

FOREIGN PATENT DOCUMENTS

| | | |
|---|---|---|
| EP | 0 646 286 B1 | 10/2002 |
| EP | 2 204 476 A2 | 7/2010 |

(Continued)

OTHER PUBLICATIONS

Junji Tamano et al., "Vacuum Lithography—A Completely Dry Lithography Using Plasma Processing," Plasma Chemistry and Plasma Processing, vol. 1, No. 3, 1981, 8 pages.

(Continued)

*Primary Examiner* — Andy Huynh
*Assistant Examiner* — Sitaramarao S Yechuri
(74) *Attorney, Agent, or Firm* — Haynes and Boone, LLP

(57) ABSTRACT

To reduce warpage in at least one area of a wafer, a stress/warpage management layer (810) is formed to over-balance and change the direction of the existing warpage. For example, if the middle of the area was bulging up relative to the area's boundary, the middle of the area may become bulging downward, or vice versa. Then the stress/warpage management layer is processed to reduce the over-balancing. For example, the stress/management layer can be debonded from the wafer at selected locations, or recesses can be formed in the layer, or phase changes can be induced in the layer. In other embodiments, this layer is tantalum-aluminum that may or may not over-balance the warpage; this layer is believed to reduce warpage due to crystal-phase-dependent stresses which dynamically adjust to temperature changes so as to reduce the warpage (possibly keeping the wafer flat through thermal cycling). Other features are also provided.

22 Claims, 5 Drawing Sheets

(56) References Cited

U.S. PATENT DOCUMENTS

| | | |
|---|---|---|
| 6,290,274 B1 | 9/2001 | Montoya |
| 7,049,170 B2 | 5/2006 | Savastiouk et al. |
| 7,169,685 B2 | 1/2007 | Connell et al. |
| 2002/0074650 A1 | 6/2002 | Takahashi et al. |
| 2003/0162368 A1 | 8/2003 | Connell et al. |
| 2006/0055073 A1 | 3/2006 | Fayaz et al. |
| 2006/0194428 A1* | 8/2006 | Nanda et al. ............ 438/624 |
| 2007/0161234 A1 | 7/2007 | Rinne et al. |
| 2008/0090372 A1 | 4/2008 | Jeong et al. |
| 2009/0085228 A1* | 4/2009 | Sun et al. ............... 257/783 |
| 2009/0227105 A1* | 9/2009 | Fu et al. ................. 438/653 |
| 2010/0285654 A1 | 11/2010 | Seo |
| 2010/0301459 A1 | 12/2010 | Akiba et al. |
| 2011/0132549 A1* | 6/2011 | Sercel et al. ............ 156/712 |
| 2011/0221053 A1 | 9/2011 | Chandrasekaran et al. |
| 2011/0221063 A1 | 9/2011 | Ichinose et al. |
| 2011/0291299 A1 | 12/2011 | Chumakov et al. |
| 2012/0139120 A1* | 6/2012 | Chow et al. ............. 257/773 |
| 2012/0171875 A1 | 7/2012 | Gan et al. |
| 2012/0301832 A1 | 11/2012 | Tsuruda |
| 2013/0084686 A1 | 4/2013 | Chandrasekaran |
| 2013/0102113 A1 | 4/2013 | Yang |
| 2013/0140715 A1 | 6/2013 | Jeng et al. |
| 2013/0147022 A1 | 6/2013 | Yoon et al. |
| 2013/0152363 A1 | 6/2013 | Horng |
| 2013/0177281 A1 | 7/2013 | Kosenko et al. |
| 2013/0183831 A1 | 7/2013 | Yu et al. |
| 2013/0260535 A1 | 10/2013 | Chen et al. |
| 2013/0292455 A1 | 11/2013 | Brofman et al. |
| 2015/0035554 A1* | 2/2015 | Dang et al. ............ 324/756.01 |

FOREIGN PATENT DOCUMENTS

| | | |
|---|---|---|
| EP | 2 565 913 A2 | 3/2013 |
| JP | 2002-190488 | 7/2002 |
| WO | 2015084848 A3 | 11/2015 |

OTHER PUBLICATIONS

Richard Webb, "Temporary bonding enables new processes requiring ultra-thin wafers," SolidState Technology, The International Magazine for Semiconductor Manufacturing, Feb. 2010, 4 pages.

3M, "3M™ Wafer Support System," product pamphlet, Dec. 2009, 4 pages.

M. Tang et al., "High-Q on-chip inductor using extremely thick silicon dioxide and copper-damascene technology," IEEE, Electronics Letters, Jan. 31, 2008, vol. 44, No. 3, 3 pages.

Written Opinion of International Searching Authority in PCT application No. PCT/US2014/068162, mailed Jul. 30, 2015, 10 pages.

International Search Report in PCT application No. PCT/US2014/068162 dated Jul. 30, 2015, 6 pages.

* cited by examiner

WARPAGE REDUCTION IN STRUCTURES WITH ELECTRICAL CIRCUITRY

BACKGROUND OF THE INVENTION

The present invention relates to electrical circuitry, and more particularly to warpage reduction in structures with electrical circuitry. Exemplary structures include semiconductor integrated circuits.

FIG. 1 is a side view of a structure having one or more semiconductor integrated circuits (ICs) 110 bonded to a substrate 120 with solder 130. Substrate 120 can be another IC, or a packaging substrate such as an interposer, or a wiring board; substrate 120 may include conductive lines connecting the ICs 110 to each other or to other circuits. Additional features may be present, e.g. heat sink 160. ICs 110 and substrates 120 should preferably be planar as in FIG. 1, but they can be warped (FIGS. 2 and 3). Warpage causes vary. For example, in FIG. 4, IC 110 includes a semiconductor substrate 410 and an overlying layer 420 (e.g. metal) which was deposited at a high temperature and then cooled. In cooling, layer 420 shrank more than substrate 410 (because layer 420 has a higher coefficient of thermal expansion (CTE)), so the structure shrank on top more than the bottom (due to compressive stress on top). Warpage can also be as in FIG. 5 if substrate 410 shrinks more than layer 420 (tensile stress on top). Warpage may also be caused by shrinkage due to curing of a polymeric layer after deposition. In addition, warpage may relate to non-uniform heating and cooling rates; choice of materials; manufacturing parameters such as pressures, compositions, ambient, etc.; circuit design; and structural features, e.g. the particular placement of structural elements and their attachments and interconnections.

Warpage can damage the structure elements as illustrated in FIGS. 2 and 3. For example, in FIG. 2, the solder connections in the middle of IC 110 are farther from substrate 120 than at the edges. Consequently, the solder connections in the middle can crack or break, impeding electrical functionality. The same is true for the edge connections in FIG. 3. Of note, solder connections should preferably be small to reduce the lateral size of the structure, but the solder connections cannot be made small if they have to accommodate warpage. Warpage reduction is therefore highly desirable.

Warpage can be reduced by forming an extra layer in the IC to balance the warping stresses caused by other layers. For example, U.S. Pat. No. 7,169,685 issued Jan. 30, 2007 to Connell et al. describes a "stress balancing layer" formed on the wafer's backside to balance the stresses caused by a layer formed on the front side. Another example is U.S. Pre-Grant Publication no. 2010/0285654 A1 of U.S. patent application Ser. No. 12/839,573 by Seo, which describes forming a stress-relieving pattern in a layer formed over a substrate.

SUMMARY

This section summarizes some features of the invention. Other features may be described in the subsequent sections. The invention is defined by the appended claims, which are incorporated into this section by reference.

Some fabrication methods of the present invention achieve warpage reduction by first over-balancing the warpage, i.e. reversing the warpage direction. For example, if the warpage is as in FIG. 2, the warpage direction is changed to be as in FIG. 3. In particular, a layer is formed to over-balance the warpage, and the layer is processed to reduce the warpage. In some embodiments, over-balancing increases the range of warpage modifications made available by this layer. Below, this layer is called a "stress/warpage management layer" even though it may (or may not) be used for purposes other than warpage reduction.

In some embodiments, the over-balanced warpage is reduced by forming recesses in the stress/warpage management layer to reduce the stress induced by the layer. Alternatively or in addition, the layer can be debonded from the rest of the structure at selected locations. (Debonding involves weakening or breaking the molecular bonds.) In other embodiments, the layer can be heated to induce a phase change in the layer.

In some embodiments, the layer reduces the wafer warpage even without over-balancing or further processing, due to the layer's crystal structure and in particular crystal phase changes that dynamically adjust to temperature. For example, the layer can be a tantalum-aluminum alloy having 10% to 60% of aluminum by weight. The phase composition (i.e. distribution of crystal phases through the layer) automatically adjusts to temperature changes to urge the layer to planar geometry, reducing or eliminating the wafer warpage in subsequent thermal cycling (e.g. in solder reflow and/or in circuit operation). In some embodiments, the warpage is reduced but not over-balanced in the deposition of the TaAl layer.

Some embodiments provide manufactures with stress/management layers or other features described above.

The invention is not limited to particular materials or other features or advantages described above except as defined by the appended claims.

DESCRIPTION OF SOME EMBODIMENTS

The embodiments described in this section illustrate but do not limit the invention. The invention is defined by the appended claims.

Figure 1:
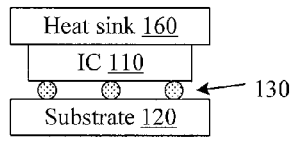
FIGS. 1, 2, 3, 4, 5 are side views of structures with electrical circuitry according to prior art.
Figure 2:
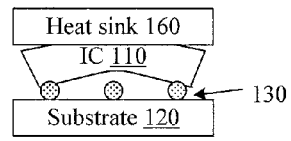
Figure 3:
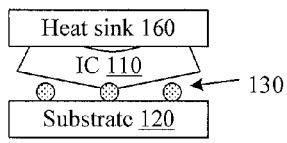
Figure 6:
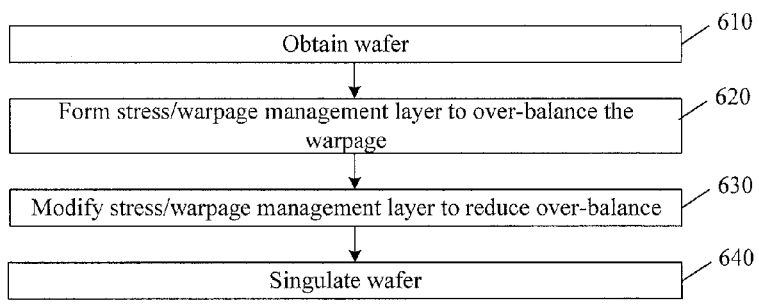
FIG. 6 is a flow chart of a fabrication process according to some embodiments of the present invention.
Figure 7:
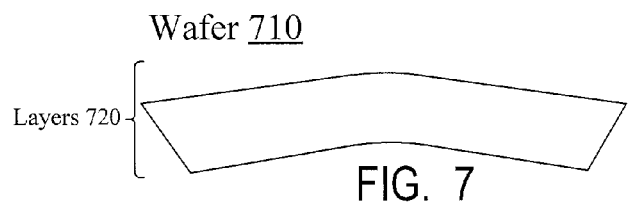
FIGS. 7, 8, 9, 10 are cross sectional side views of structures with electrical circuitry at different stages of fabrication according to some embodiments of the present invention.

FIG. 6 is a flow chart of an exemplary manufacturing process according to some embodiments of the present invention. At step 610, a wafer is obtained, e.g. wafer 710 (FIG. 7) made of one or more layers 720. This can be a semiconductor wafer (i.e. a wafer including a semiconductor substrate such as monocrystalline silicon or some other material), or a wafer having an insulating or conductive substrate. The wafer incorporates electrical circuitry (not shown) including, for example, transistors, resistors, capacitors, interconnect lines, and/or other circuit elements. The wafer can be at any stage of fabrication, possibly (though not necessarily) at a late stage, e.g. after formation of electrical circuitry. Wafer 710 may later be singulated into dice 110 (as in FIG. 1), or may be used in the final product in the non-singulated state. In FIG. 7, the wafer has a "negative" warpage, i.e. the wafer's middle protrudes upward relative to the edges. However, "negative" is a relative term used herein for ease of reference: if the wafer is turned upside down, the warpage will be "positive" as in FIG. 3. The warpage could also be negative in some portions of the wafer and positive in other portions, and/or negative in some vertical cross sections and positive in others (as in a saddle-shaped wafer). However, in some manufacturing processes, the warpage is all negative or all positive throughout the wafer. In some manufacturing processes, the warpage is all negative or positive at least with respect to the points on the wafer boundary, i.e. the boundary points are all below, or all above, the wafer's points near the center. The invention is not limited to any particular warpage geometry.

Figure 8:
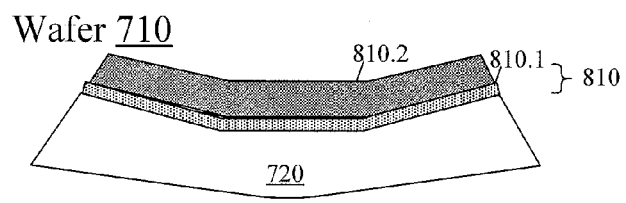

At step 620 of FIG. 6, stress/warpage management layer 810 (FIG. 8) is formed on top of the wafer to over-balance the wafer warpage at least in one area or with respect to at least some boundary points. In the example of FIG. 8, the wafer warpage changes from negative to positive.

At step 630, layer 810 is modified to reduce or eliminate the wafer warpage. The layer modification can be performed to weaken the stresses introduced by layer 810.

In the example of FIG. 8, layer 810 includes an adhesive sub-layer 810.1 and a stress/warpage management sub-layer 810.2. At step 630, adhesive 810.1 will be debonded at selected locations. For example, adhesive 810.1 can be a type used in prior art for temporary attachment to a handle wafer or to a dicing tape or for other purposes. Exemplary adhesives are UV-curable adhesives of types LC-3200, LC-4200, LC-5200 available from 3M™ Corporation and described in R. Webb, "Temporary bonding enables new processes requiring ultra-thin wafers", Solid State Technology (February 2010), incorporated herein by reference. See also "Production Proven: Temporary wafer bonding for advanced IC packaging" (3M™ Corporation, 2009), incorporated herein by reference. These adhesives can be debonded using ultraviolet (UV) light. Exemplary thicknesses of layer 810.1 are 20 μm or less. Adhesive layer 810.1 may include an acrylic layer overlying a thin carbon layer; the carbon layer can be debonded by laser light. The invention is not limited to particular adhesives, dimensions, or debonding methods.

Figure 4:
Figure 5:

The choice of materials and fabrication processes for layer 810.2 depends on the processing technology, desired warpage reduction, and other factors. For example, if the wafer will be subjected to high temperature processing, then layer 810.2 should be able to withstand such processing. If the temperature budget has been exhausted, then layer 810.2 should be deposited at a low temperature. If debonding of adhesive 810.1 will employ light impinging from the top, then layer 810.2 should be transparent or semitransparent to such light. For the 3M™ adhesives specified above and for debonding by light from the top, layer 810.2 can be, for example, silicon dioxide, or silicon nitride, or silicon carbide, or silicon oxynitride, or combinations thereof, deposited by any suitable method, for example by VVD (Vacuum Vapor Deposition); CVD (Chemical Vapor Deposition), possibly PECVD (Plasma Enhanced CVD); at any suitable temperature (below 250° C. in some embodiments); to any suitable thickness (e.g. 2500 nm or below, possibly 20 to 70 nm). The process parameters can be controlled to provide compressive (FIG. 4) or tensile (FIG. 5) forces to over-balance the warpage. See e.g. U.S. Pre-Grant Patent Publication 2013/0147022 A1 of Yoon et al., published Jun. 13, 2013 and incorporated herein by reference, describing deposition of passivation layers with offsetting stress characteristics. In some embodiments, layers 810.1 and 810.2 are made of the same material (adhesive) and are formed in a single process (to put it differently, any one of these layers can be omitted).

In some embodiments, the wafer warpage is measured before forming layer 810.2, and the thickness of layer 810.2 is chosen (e.g. from a look-up table) based on this measurement and on experimental results obtained from test wafers or from simulation. The warpage measurement can be performed before or after forming the adhesive 810.1.

In some embodiments, adhesive 810.1 has no measurable impact on the wafer warpage. In other embodiments, adhesive 810.1 causes the same type of stress (compressive or tensile) as layer 810.2 to increase the over-balancing effect. Adhesive 810.1 may also counteract the over-balancing effect, and in this case the layer 810.2 is deposited to overwhelm the adhesive 810.1.

Figure 9:
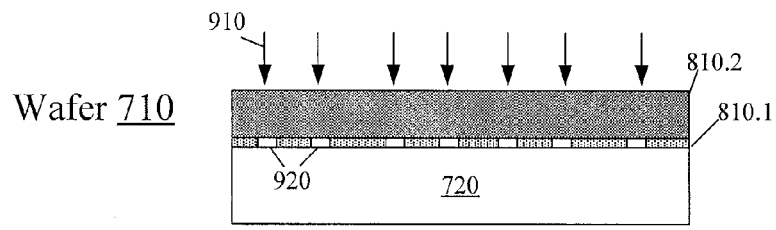

Step 630 (FIG. 6) is illustrated in FIG. 9: light beam(s) 910, possibly laser beams, are emitted to weaken the bonds created by adhesive 810.1 at selected locations 920 and thus to reduce the wafer warpage. In some embodiments, the debonding is due to heat induced by the laser. If needed, the light beams are focused to prevent debonding of layer 810 at other locations. In the embodiment shown, the light reaches the adhesive from the top, through layer 810.2, but in other embodiments the light reaches the adhesive from the bottom, through the underlying layers 720. The light may weaken the bonds between adhesive 810.1 and layer 810.2, or between adhesive 810.1 and the top of layers 720, or both. The size and placement of locations 920 are experimentally determined in advance. For example, in some embodiments, the wafer warpage is measured after forming the layer 810.2 and before debonding the adhesive; the locations 920 are determined (e.g. from a look-up table) based on the warpage measurement and experimental data obtained in advance. In other embodiments, the locations 920 may be at least partially determined based on measurements performed during the debonding process. For example, in some embodiments, candidate locations 920 are determined in advance based on measurements performed on test wafers. The set of all candidate locations 920 is subdivided into subsets. Step 630 is performed in multiple iterations, with each iteration providing the light 910 to just one subset of locations 920. After each subset, the warpage is measured, and if desired then the light 910 is provided at another subset or subsets as determined by the warpage measurement. In other embodiments, locations 920 are entirely determined based on measurements performed on wafer 710 to be processed, without resort to a test wafer. In some embodiments, the size (maximum lateral dimension) of each location 920 is 2 μm to 30 μm, but this is not limiting. If debonding at a single location 920 changes the warpage by only a small value, then warpage can be tightly controlled.

In some embodiments, a location 920 is a line; locations 920 are (or include) lines that partition the wafer 710 (and possibly partition each die in the wafer) as described, for example, in the aforementioned U.S. Pre-Grant Publication US 2010/0285654 A1 of U.S. patent application Ser. No. 12/839,573 by Seo.

At step 640 (FIG. 6), the wafer is singulated into dies (e.g. individual ICs 110). See FIG. 10. Step 640 can be omitted.

Figure 10:
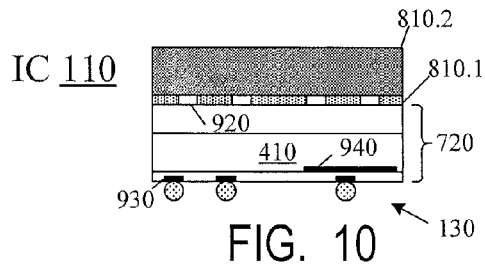

Individual dies 110 or the entire wafer 710 are bonded to other substrates or electrical circuitry as needed. In the example of FIG. 10, layers 720 include contact pads 930 at the bottom surface of the wafer. Solder 130 is attached to the bottom contact pads and hence does not interfere with layer 810. Layers 720 also include a semiconductor substrate 410 with active areas 940 used to form circuit elements (e.g. transistors, capacitors, and/or other elements). The active areas are at the bottom surface of the substrate. These details are not limiting—active areas 940 may be at the top surface of substrate 410, and circuit elements made at the top surface can be connected to contact pads 930 with conductive lines (e.g. metalized through-silicon vias). Active areas 930 may be absent, e.g. wafer 710 may be a passive interposer providing interconnections between other ICs and having no diodes or transistors.

Contact pads 930 may also be provided at the top of the wafer. In this case, layer 810 is patterned to expose the contact pads. The patterning operation may be performed before, during or after the exposure to light 910, and before or after singulation.

Layer 810 can be left in place in the final structure or partially or completely removed after bonding the wafer or IC to other structural elements.

In some embodiments, the wafer is singulated before deposition of layer 810, or after deposition of layer 810 but before partial debonding (by light 910 for example). This is advantageous because singulation can affect warpage, and since debonding is performed separately on each die 110 the debonding can be adjusted to each die's warpage.

The same fabrication techniques can be used if the warpage is initially positive (as in FIG. 3), or if the warpage direction varies across the wafer. The layer 810 over-balances the warpage in at least one wafer area. The debonding can be performed just in those areas in which the warpage is over-balanced, to reduce the over-balancing effect. In other areas the warpage may be enhanced by layer 810, and layer 810 can be removed in these other areas (e.g. by a masked etch). Also, or in the alternative, a second stress/warpage management layer (not shown) can be formed over layer 810 or on the opposite side of the wafer, to over-balance the warpage in these other areas. The second layer can then be processed to reduce this over-balancing. The second layer can be formed and processed by the same techniques as layer 810 or by other techniques described below. Other stress/warpage management layers can be added and processed by such techniques as needed.

In some embodiments, the warpage is improved by at least 10%, i.e. the final warpage of the wafer 710 or a die 110 is at most 90% of the warpage which would be obtained in the absence of layer 810 (alone or in combination with other stress/warpage management layers). The warpage values can be defined by any one of the techniques illustrated in FIGS. 11-14.

Figure 11:
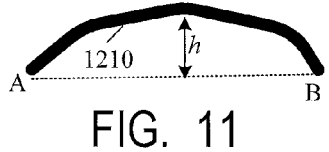
FIG. 11 is a cross sectional side view of a structure with electrical circuitry to illustrate warpage measurements used in some embodiments of the present invention.

Referring to FIG. 11, the warpage can be defined as a maximum variation of the height h along one of the wafer surfaces, e.g. the bottom surface in FIG. 11. More particularly, the wafer is placed on a horizontal surface so that at least three points on the wafer's bottom surface contact the horizontal surface, and the height h is measured along the vertical dimension.

Figure 12:
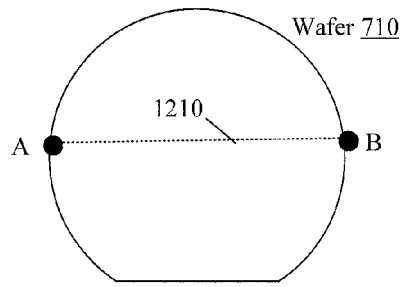
FIGS. 12 and 13 are top views of structures with electrical circuitry to illustrate warpage measurements used in some embodiments of the present invention.
Figure 13:
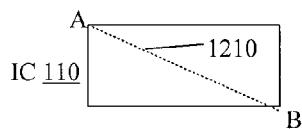
Figure 14:
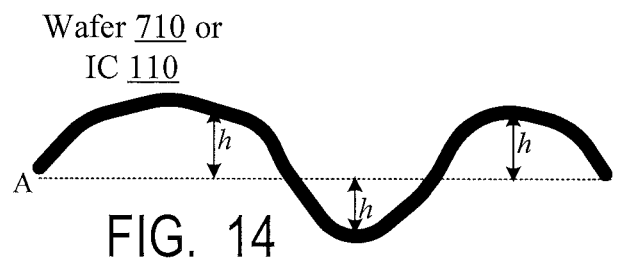
FIG. 14 is a cross sectional side view of a structure with electrical circuitry to illustrate warpage measurements used in some embodiments of the present invention.

In other embodiments, the warpage is defined by measuring the height h only relative to two points on the wafer surface, such as points A and B in FIG. 12 (top view). In this embodiment, the points A and B are opposite points on the wafer, i.e. they lie on the wafer diameter. In other embodiments, the wafer is not symmetric, and the points A and B are such that the distance between them would be the maximum distance (i.e. at least as large as the distance between any other two points on the wafer surface) if the wafer were flat. The height h is measured along a line 1210 which would be a straight line connecting A and B if the wafer were flat. The warpage is defined as the maximum height value. In other embodiments, multiple pairs of points A and B are used, and the warpage is defined as the maximum over all such pairs.

The same warpage definitions can be used for a die (i.e. a single IC 110). If the die 110 is rectangular when flat (FIG. 12), the points A and B can be at the opposite corners on any one of the two diagonals. In some embodiments, the warpage is the maximum height on an arbitrarily chosen diagonal, or the maximum over the two diagonals.

The warpage may change its sign over the wafer or die (see FIG. 14), and the height h is always measured as an absolute value, i.e. is never negative. In other embodiments, separate h values are determined for positive and negative warpages, and the stress/warpage management layer or layers are used to improve only the positive or only the negative warpage.

In some embodiments, the warpage improvement for the wafer or at least one die is at least 20%, or at least 30%, or at least 40%, or at least 50%, or at least 60%, or at least 70%, or at least 80%, or at least 90%. In some embodiments, a die's warpage measured along the diagonals changes from over 300 μm to under 100 μm for a rectangular die having each side of 40 mm or less.

Figure 15:
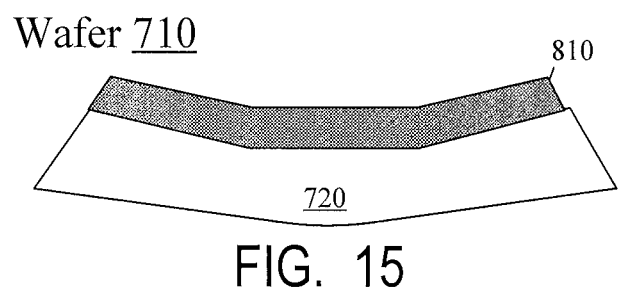
FIGS. 15, 16 are cross sectional side views of structures with electrical circuitry at different stages of fabrication according to some embodiments of the present invention.
Figure 16:
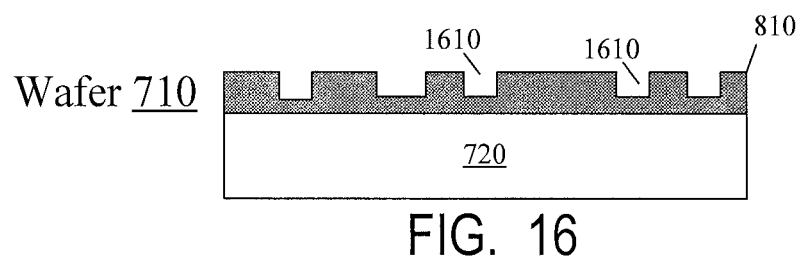

In some embodiments, step 630 includes one or more processes in addition, or instead of, debonding. For example, layer 810 can be weakened by recesses, e.g. made by physical and/or chemical etching and/or laser ablation. For example, in some embodiments, step 610 can be as described above in connection with FIG. 7. Then, at step 620, layer 810 is deposited to over-balance the warpage as shown in FIG. 15, and weakened at step 630 by laser ablation (FIG. 16) that forms recesses 1610 in layer 810 to reduce the warpage over-balance. Recesses 1610 may or may not go through the layer 810. Suitable materials and fabrication processes for layer 810 include those described above for layer 810.2, but layer 810 does not need to be transparent. Some embodiments use one or more materials in one or more of the following categories: composite materials, polymeric materials, glass, ceramic, conductive materials. In some embodiments, such materials are deposited by molding, or spin coating, or PVD (Physical Vapor Deposition), or other suitable methods, to a thickness of 0.1 μm to 20 μm or more (in some embodiments, the preferred thickness is below 50 μm). In some of these embodiments, the materials are patterned by lithography (possibly dry lithography) to remove about 10% to 85% of the thickness at selected locations; each recess 1610 can be 1 μm to 30 μm in size (maximum lateral dimension). The size and position of recesses 1610 can be determined in the same way as for locations 920 (FIG. 9), e.g. using warpage measurements.

In some embodiments, layer 810 is weakened by phase change. For example, layer 810 can be metal, possibly an alloy (e.g. tantalum or its alloys), deposited by a suitable method (e.g. PVD) and then weakened by heat (using infrared light or other heating source).

In some embodiments, layer 810 may or may not over-balance the warpage but still reduces the warpage. For example, layer 810 can be a tantalum-aluminum alloy having 10% to 60% of aluminum by weight, deposited by any suitable method, e.g. PVD, to a suitable thickness, e.g. 2 μm or below. This layer urges the wafer to the planar state, reducing or possibly eliminating the warpage. This urging forces (flattening forces) remain in place throughout temperature changes except when the temperature becomes very high, e.g.

to melt the alloy. In particular, the flattening forces remain in place if the temperature does not exceed typical solder reflow temperatures, i.e. 400° C. or below (260° C. for many solders). It is believed that such persistence of the flattening forces is due to the phase composition which dynamically adjusts to the temperature so as to dynamically adjust the stresses in the wafer. The invention does not depend on any particular theory however.

Figure 17:
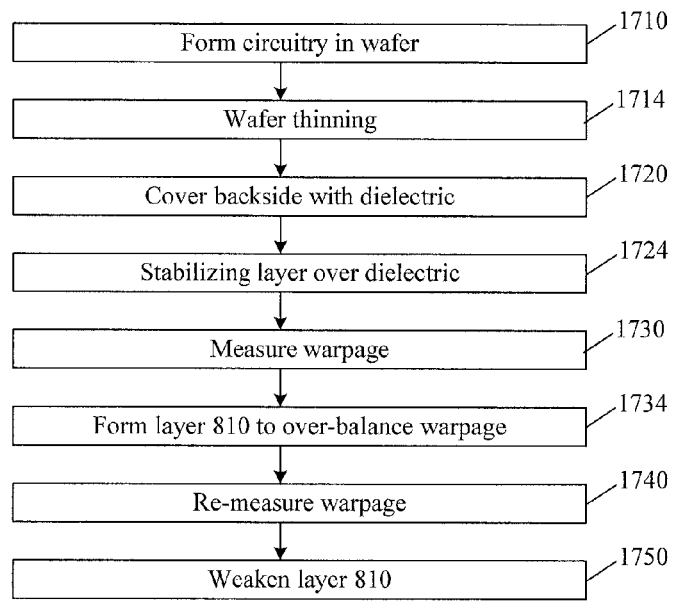
FIG. 17 is a flow chart of a fabrication process according to some embodiments of the present invention.

The fabrication techniques discussed above can be augmented with other techniques as appropriate for particular requirements. FIG. 17 is a flow chart of an exemplary fabrication process. At step 1710, circuitry is manufactured in wafer 710. At step 1714, the wafer is thinned to its final thickness, e.g. by grinding and/or etching the wafer backside. At this stage, the wafer may be warped (e.g. as described above in connection with FIG. 7).

Figure 18:
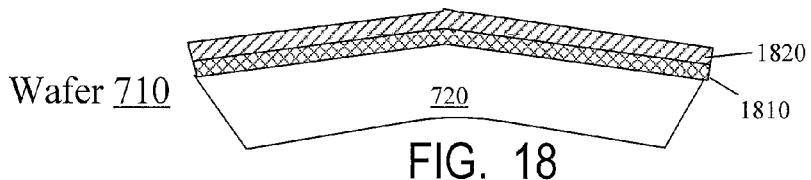
FIGS. 18, 19, 20, 21 are cross sectional side views of structures with electrical circuitry at different stages of fabrication according to some embodiments of the present invention.

Before forming the layer 810 on the backside, the backside can be protected with an additional layer. For example, if the wafer backside includes non-insulating semiconductor material (e.g. silicon) or conductive material (e.g. conductive lines), then at step 1720, a dielectric layer 1810 (FIG. 18) may be formed on the backside. In some embodiments, dielectric 1810 is a silicon compound (e.g. oxide or nitride or oxynitride) formed by CVD (Chemical Vapor Deposition), possibly PECVD, to a thickness below 200 nm.

Optionally, a stabilizing layer 1820 (FIG. 18) is then formed at step 1724 to reduce the wafer warpage, possibly without over-balancing the warpage (i.e. the warpage does not change its sign). For example, the stabilizing layer can be silicon oxide, or silicon nitride, or metal, or other layer or layers formed by any process suitable for this processing stage (e.g. taking into account the temperature budget). For example, a TaAl layer can be deposited and heated to induce wafer-flattening phase changes as described above for layer 810.

Figure 19:
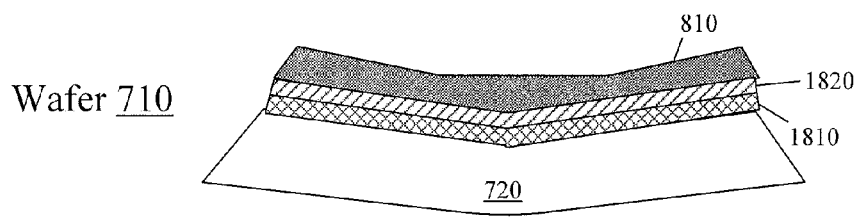

At step 1730, the wafer warpage is measured, and at step 1734 a layer 810 is formed as in FIG. 8 or 15 for example, to over-balance the warpage. See FIG. 19. At step 1740, layer 810 is weakened as described above in connection with FIGS. 9 and 16. Further processing may include, for example, attaching a dicing tape (possibly formed of one or more polymeric layers) over the layer 810, and singulating the wafer. Other protective layers can be formed before attaching the dicing tape.

Figure 20:
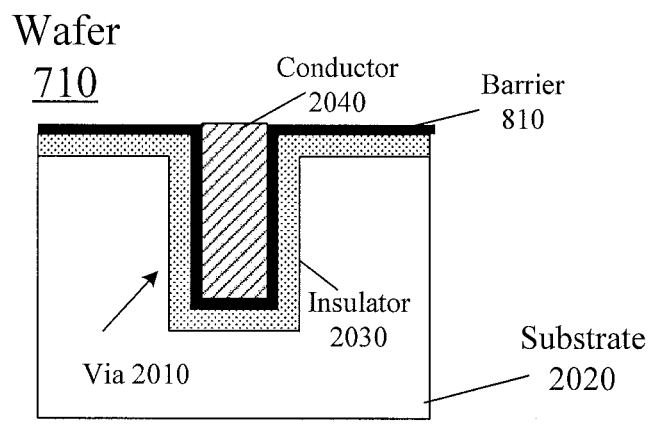
Figure 21:
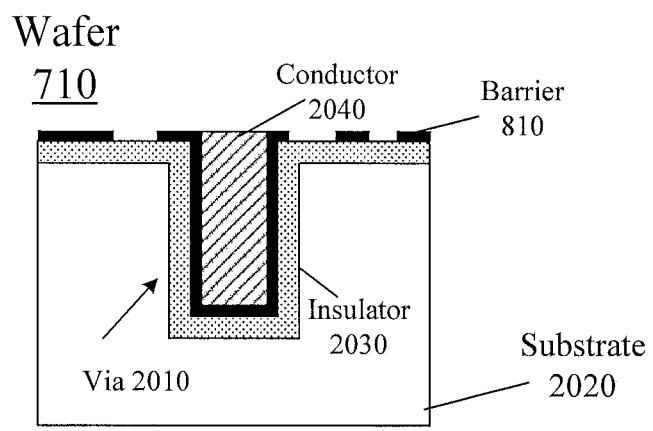

FIGS. 20-21 illustrate another embodiment which uses a barrier layer as a stress/warpage management layer 810. These figures illustrate vertical cross-sections of a wafer 710 (e.g. an interposer) in the process of fabrication. A via or vias 2010 are formed in a substrate 2020 (e.g. monocrystalline silicon or some other semiconductor, or insulator, or conductor material). If needed (e.g. if the substrate is not insulating), an insulating layer 2030 is formed on the wafer surface. Barrier layer 810 is formed on insulator 2030. Conductor 2040 (e.g. metal) is deposited in vias 2010, possibly to fill the vias. Conductor 2040 may be used to form damascene interconnects, and/or backside contacts (the backside contacts are obtained when the substrate 2020 and insulator 2030 are etched from the bottom), and/or other features. Suitable processes for use up to this stage are described, for example, in U.S. Pat. No. 7,049,170 issued May 23, 2006 to Savastiouk et al; and U.S. Pre-Grant Publication no. 2013/0177281 of U.S. patent application Ser. No. 13/362,898 filed Jan. 31, 2012 by Kosenko et al., both incorporated herein by reference.

For example, in some embodiments, conductor 2040 is copper electroplated on a seed layer (possibly also copper, not shown separately). The electroplating process may overfill the vias 2010, so after the plating the copper can be removed from over the top of the wafer. This can be done for example by chemical mechanical polishing (CMP). The copper (including the seed layer) remains in the areas of vias 2010. However, unlike in prior art processes, the CMP does not remove the barrier layer 810, which continues to cover the wafer. The barrier layer could for example be tantalum of a 20 nm to 100 nm thickness (the invention is not limited to any particular thickness). The barrier layer is then patterned (FIG. 21) to reduce the wafer warpage. Individual portions of barrier 810 on top of the wafer may have no electrical functionality and no other function than warpage reduction.

The wafer can later be processed as needed. For example, if the wafer is an interposer, then redistribution layers (interconnect layers) can be formed on top of the wafer so as to connect to conductor 2040; if needed the wafer can be thinned from the bottom to expose the conductor 2040 to create backside contacts from conductor 2040; etc. See the aforementioned U.S. Pat. No. 7,049,170 and U.S. Pre-Grant Publication no. 2013/0177281.

Some embodiments of the present invention provide a manufacturing method comprising:

obtaining a first structure (e.g. layers 720, possibly with 1810 and/or 1820) comprising electrical circuitry, the first structure comprising a first surface (e.g. top surface in FIG. 7) and a second surface opposite to the first surface, at least one of the first and second surfaces comprising a first area which is warped;

forming a first layer (e.g. 810) on the first surface to over-balance a warpage of the first area; and processing the first layer to reduce the first area's warpage.

Some embodiments provide a manufacturing method comprising:

obtaining a first structure (e.g. layers 720, possibly with 1810 and/or 1820) comprising electrical circuitry, the first structure comprising a first surface and a second surface opposite to the first surface, at least one of the first and second surfaces comprising a first area which is warped;

forming a first layer (e.g. 810) of tantalum-aluminum alloy on the first surface, the aluminum content being 10% to 60% by weight, the warpage being reduced as a result of forming the first layer.

In some embodiments, the first layer is formed by physical vapor deposition.

In some embodiments, the first layer has a thickness of 2 μm or less.

Some embodiments provide a manufacture comprising:

a first portion (e.g. 720, possibly with 1810 and/or 1820) comprising electrical circuitry, the first portion comprising a first surface and a second surface opposite to the first surface, at least one of the first and second surfaces comprising a first area; and a first layer (e.g. 810) on the first surface, the first layer comprising an adhesive which bonds the first layer to the first surface over the entire first area except at one or more selected locations at which the adhesive is debonded from the first area.

Some embodiments provide a manufacture comprising:

a first portion (e.g. 720, possibly with 1810 and/or 1820) comprising a first surface, a second surface opposite to the first surface, and electrical circuitry between the first and second surfaces, wherein one of the first and second surfaces comprises a first area;

a first layer (e.g. 810) on the first surface, the first layer satisfying one or more of the following conditions (A) and (B):

(A) the first layer not being uniformly bonded to the first surface;

(B) the first layer comprising one or more recesses;
wherein if the first layer were absent, then the first area would have a first warpage;
wherein if the first layer did not satisfy said one or more of the conditions (A) and (B), then the first area would have a second warpage of an opposite sign than the first warpage.

Some embodiments provide a manufacture comprising:
a first portion (e.g. 720, possibly with 1810 and/or 1820) comprising electrical circuitry, the first portion comprising a first surface and a second surface opposite to the first surface, at least one of the first and second surfaces comprising a first area; and
a first layer on the first surface, the first layer being a layer of tantalum-aluminum alloy, the aluminum content being 10% to 60% by weight.

The invention is not limited to particular materials, deposition techniques, warpage measurement techniques, or other features described above except as defined by the appended claims. Other embodiments and variations are within the scope of the invention, as defined by the appended claims.

The invention claimed is:

1. A manufacturing method comprising:
obtaining a first structure comprising electrical circuitry, the first structure comprising a first surface and a second surface opposite to the first surface, at least one of the first and second surfaces comprising a first area which is warped;
forming a first layer on the first surface to over-balance a warpage of the first area; and
processing the first layer to reduce the first area's warpage;
wherein:
the first layer is adhesively bonded to the first surface; and
processing the first layer comprises debonding the first layer at one or more selected locations.

2. The method of claim 1 wherein the first layer comprises a first sub-layer and an adhesive which bonds the first sub-layer to the first surface, the first sub-layer having a different composition than the adhesive.

3. The method of claim 1 wherein the debonding is performed using light and/or heat.

4. The method of claim 1 wherein processing the first layer comprises removing one or more portions of the first layer at one or more selected locations.

5. The method of claim 1 wherein the first structure comprises one or more contact pads for connection to the electrical circuitry; and
after processing the first layer, the method comprises attaching one or more of the contact pads to one or more conductive lines in one or more second structures.

6. The method of claim 1 wherein the first area is an entire area of the first or second surface of the first structure.

7. The method of claim 1 wherein the first structure comprises one or more semiconductor integrated circuits, and the first area is an area of a wafer or a die which comprises, or is directly attached to, said one or more of the semiconductor integrated circuits.

8. The method of claim 1 wherein said forming the first layer and said debonding of the first layer at one or more selected locations improve the warpage of the first area by at least 20%.

9. A manufacturing method comprising:
obtaining a first structure comprising a wafer comprising electrical circuitry, the wafer comprising a first surface and a second surface opposite to the first surface, at least one of the first and second surfaces comprising a first area which is warped; and
forming a stabilizing layer of tantalum-aluminum alloy on the first surface, the aluminum content being 10% to 60% by weight, the stabilizing layer being electrically insulated from said electrical circuitry, the stabilizing layer urging the wafer into a planar state at least at any temperature below 400° C., a warpage of the first area being reduced as a result of forming the stabilizing layer.

10. The method of claim 9 wherein the method further comprises:
forming a first layer over the stabilizing layer to over-balance the warpage of the first area; and
processing the first layer to reduce the warpage of the first area.

11. The method of claim 10 wherein the first layer is formed by physical vapor deposition.

12. The method of claim 10 wherein the first layer has a thickness of 2 μm or less.

13. The method of claim 10 wherein the wafer comprises one or more contact pads for connection to the electrical circuitry; and
after processing the first layer, the method comprises attaching one or more of the contact pads to one or more conductive lines in one or more second structures.

14. The method of claim 9 wherein the first area is an entire area of the first surface of the wafer.

15. A manufacture comprising:
a first portion comprising electrical circuitry, the first portion comprising a first surface and a second surface opposite to the first surface, at least one of the first and second surfaces comprising a first area; and
a first layer on the first surface, the first layer comprising an adhesive which bonds the first layer to the first surface over the entire first area except at one or more selected locations, the first area having a reduced warpage due to the first layer not being bonded to the first area at the one or more selected locations, wherein each said location is surrounded by the adhesive bonded to the first area.

16. The manufacture of claim 15 wherein the first layer comprises a first sub-layer and said adhesive which bonds the first sub-layer to the first surface, the first sub-layer having a different composition than the adhesive.

17. The manufacture of claim 15 wherein at each said location, the largest lateral dimension of each of the one or more selected locations is from 3 μm to 5 μm.

18. The manufacture of claim 15 wherein the first portion comprises one or more contact pads attached to one or more conductive lines in one or more second structures.

19. The manufacture of claim 15 wherein the first area is an entire area of the first or second surface.

20. The manufacture of claim 15 wherein the first portion comprises one or more semiconductor integrated circuits, and the first area is an area of a wafer or a die which comprises, or is directly attached to, one or more of the semiconductor integrated circuits.

21. The manufacture of claim 15 wherein the first layer reduces the warpage in the first area.

22. The manufacture of claim 15 wherein the first layer reduces the warpage in the first area by at least 20%.

* * * * *